US010362385B1

(12) United States Patent
Di Censo et al.

(10) Patent No.: US 10,362,385 B1
(45) Date of Patent: Jul. 23, 2019

(54) CONTROLLING PERCEIVED AMBIENT SOUNDS BASED ON FOCUS LEVEL

(71) Applicant: HARMAN INTERNATIONAL INDUSTRIES, INCORPORATED, Stamford, CT (US)

(72) Inventors: Davide Di Censo, Sunnyvale, CA (US); Adam Boulanger, Palo Alto, CA (US); Joseph Verbeke, San Francisco, CA (US); Stefan Marti, Oakland, CA (US)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 0 days.

(21) Appl. No.: 15/912,516

(22) Filed: Mar. 5, 2018

(51) Int. Cl.

| | |
|---|---|
| ***H03G 3/20*** | (2006.01) |
| ***H04R 1/10*** | (2006.01) |
| ***H04R 5/02*** | (2006.01) |

(52) U.S. Cl.

CPC ......... *H04R 1/1083* (2013.01); *H04R 1/1091* (2013.01); *H04R 5/02* (2013.01); *H04R 2420/01* (2013.01); *H04R 2460/01* (2013.01); *H04R 2499/13* (2013.01)

(58) Field of Classification Search

CPC ....... H04R 1/1083; H04R 1/1091; H04R 5/02

See application file for complete search history.

(56) References Cited

U.S. PATENT DOCUMENTS

| | | | | |
|---|---|---|---|---|
| 10,067,737 | B1 * | 9/2018 | Ozery | G02B 27/017 |
| 2015/0137998 | A1 * | 5/2015 | Marti | B60Q 9/00 340/901 |
| 2016/0210407 | A1 * | 7/2016 | Hwang | G06Q 50/22 |

* cited by examiner

*Primary Examiner* — Simon King

(74) *Attorney, Agent, or Firm* — Artegis Law Group, LLP

(57) ABSTRACT

In one embodiment, a focus application controls ambient sounds perceived by a user. In operation, the focus application determines a focus level associated with the user based on a biometric signal associated with the user. The focus application then determines an ambient awareness level based on the focus level. Subsequently, the focus application modifies at least one characteristic of an ambient sound perceived by the user based on the ambient awareness level.

20 Claims, 5 Drawing Sheets

CONTROLLING PERCEIVED AMBIENT SOUNDS BASED ON FOCUS LEVEL

BACKGROUND

Field of the Various Embodiments

The various embodiments relate generally to audio systems and, more specifically, to controlling perceived ambient sounds based on focus level.

Description of the Related Art

Users of a variety of listening and communications systems employ personal hearing devices to listen to music and other types of sounds. For example, in order to listen to recorded music transmitted via an MP3 player, CD player, streaming audio player, etc., a user may wear wired or wireless headphones. While the user is wearing the headphones, speakers included in the headphones deliver the requested sounds directly to the ear canals of the user via speaker(s).

In order to customize the listening experience for the user, some headphones also include functionality that enables a user to manually control the volume of ambient sound that the user hears via the headphones. Ambient sound refers to sound originating from the environment surrounding the user. For example, some ambient aware headphones include earbuds that provide a "closed" fit with the ears of the user. When these types of earphones are worn by a user, each of the earbuds creates a relatively sealed sound chamber relative to the ear of the user in order to reduce the amount of sound leaked into the external environment during operation.

Although sealed earbuds are able to deliver sound to the user without excessive sound degradation (e.g., due to leakage), sealed earbuds may isolate the user from various types of environmental sounds, such as speech, alerts, etc. Accordingly, in order to enable a user to selectively perceive environmental sounds, the headphones may include externally-facing microphones that receive ambient sound from the surrounding environment. The user may then manually adjust how the ambient sound is replicated by the headphones, which may output the selected ambient sounds in conjunction with other audio content, such as music. For example, if a user is concentrating on a particular task and does not want to be distracted by sounds in the surrounding environment, then the user may manually reduce the volume of the ambient sound that is reproduced by the speakers in order to suppress the ambient sound. By contrast, if a user wishes to be aware of the surrounding environment, then the user may manually increase the volume of the ambient sound that is reproduced by the speakers in order to enable the ambient sounds to be heard.

Requiring a user to manually control the degree to which ambient sound is reproduced by the headphones may reduce the user's ability to perform certain types of tasks. For example, when the user is concentrating on a task, retrieving a smartphone, executing a headphone configuration application via the smartphone, and then making manual selections via the headphone configuration application may reduce the user's ability to concentrate on the task. Further, at times, the user may be unable or unwilling to make such a manual selection. For example, if the user forgets the location of a physical button or slider that is configured to adjust the volume of ambient sound, then the user may be unable to control the degree to which ambient sound is reproduced by the headphones. In another example, if the user is wearing gloves, then the user may be unable to properly manipulate a button or slider in order to properly adjust the volume of ambient sound that can be heard by the user.

As the foregoing illustrates, more effective techniques for controlling ambient sounds perceived by a user would be useful.

SUMMARY

One embodiment sets forth a method for controlling ambient sounds perceived by a user. The method includes determining a focus level based a biometric signal associated with the user; determining an ambient awareness level based on the focus level; and modifying at least one characteristic of an ambient sound perceived by the user based on the ambient awareness level.

Further embodiments provide, among other things, a system and a computer-readable medium configured to implement the method set forth above.

At least one technical advantage of the disclosed techniques relative to prior art is that how and/or whether ambient sounds are perceived by a user can be automatically controlled based on a focus level—without requiring manual input from a user. For example, the degree to which an ambient sound can be heard by the user may be increased or decreased in order to enable the user to concentrate on a task without interruption, such as a distracting sound in the surrounding environment or needing to manually adjust an ambient sound level. Consequently, the ability of the user to concentrate on a given task is improved.

BRIEF DESCRIPTION OF THE DRAWINGS

So that the manner in which the above recited features can be understood in detail, a more particular description of the various embodiments, briefly summarized above, may be had by reference to certain embodiments, some of which are illustrated in the appended drawings. It is to be noted, however, that the appended drawings illustrate only typical embodiments and are therefore not to be considered limiting of scope, for the contemplated embodiments may admit to other equally effective embodiments.

DETAILED DESCRIPTION

In the following description, numerous specific details are set forth to provide a more thorough understanding of the various embodiments. However, it will be apparent to one of skill in the art that various embodiments may be practiced without one or more of these specific details.

System Overview

Figure 1:
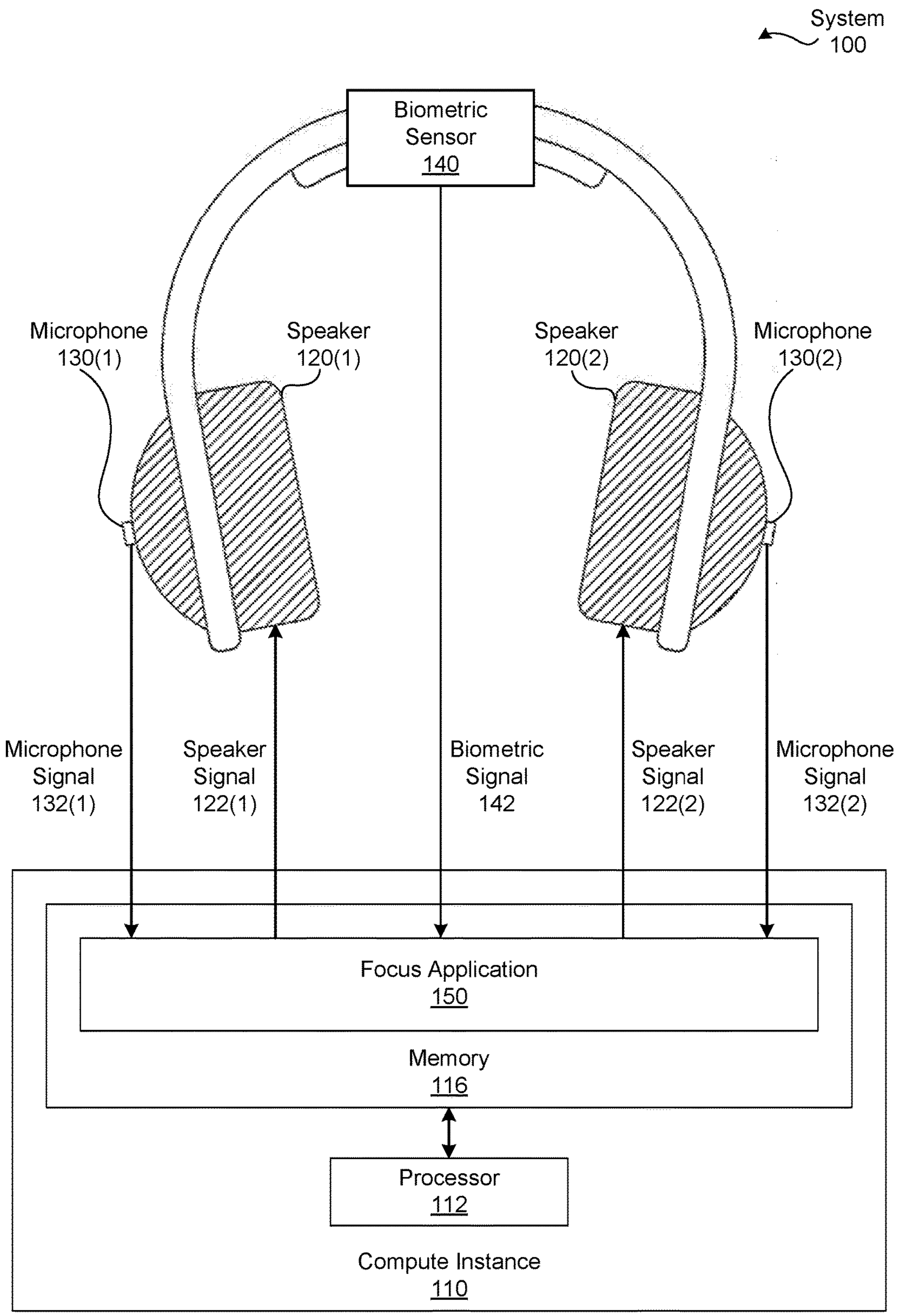
FIG. 1 illustrates a system that is configured to control ambient sounds perceived by a user, according to various embodiments.

FIG. 1 illustrates a system 100 that is configured to control ambient sounds perceived by a user, according to various embodiments. The system 100 includes, without limitation, two microphones 130, two speakers 120, a biometric sensor 140, and a compute instance 110. For explanatory purposes, multiple instances of like objects are denoted with reference numbers identifying the object and parenthetical numbers identifying the instance, where needed.

In alternate embodiments, the system 100 may include any number of microphones 130, any number of speakers 120, any number of biometric sensors 140, and any number of compute instances 110, in any combination. Further, the system 100 may include, without limitation, other types of sensory equipment and any number and type of audio control devices. For instance, in some embodiments, the system 100 may include a global positioning system (GPS) sensor and a volume control slider.

As shown, the system 100 includes headphones with inwardly facing embedded speakers 120 and outwardly facing embedded microphones 130. When the headphones are worn by a user, the speaker 120(1) targets one ear of the user, and the speaker 120(2) targets the other ear of the user. In operation, the speaker 120(*i*) converts a speaker signal 122(*i*) to sounds that are directed toward the targeted ear. When translated to sounds and transmitted to the ears of the user, the speaker signals 122 provide an overall listening experience. In some embodiments, a stereo listening experience may be specified, and the content of the speaker signal 122(1) and 122(2) may differ. In other embodiments, a monophonic listening experience may be specified. In such embodiments, the speaker signals 122(1) and 122(2) may be replaced with a single signal that is intended to be received by both ears of the user.

The microphone 130(*i*) converts ambient sounds detected by the microphone 130(*i*) to the microphone signal 132(*i*). As referred to herein, "ambient sounds" may include any sounds that exist in the area surrounding a user of the system 100, but are not generated by the system 100. Ambient sounds are also referred to herein as "environmental sounds." Examples of ambient sounds include, without limitation, voices, traffic noises, birds chirping, appliances, and so forth.

The speaker signal 122(*i*) includes, without limitation, a requested playback signal (not shown in FIG. 1) targeting the speaker 120(*i*) and an ambient adjustment signal (not shown in FIG. 1). The requested playback signal represents requested sounds from any number of listening and communications systems. Examples of listening and communication systems include, without limitation, MP3 players, CD players, streaming audio players, smartphones, etc.

The ambient adjustment signal customizes the ambient sounds that are perceived by the user when wearing the headphones. Each of the ambient adjustment signals comprises an awareness signal or a cancellation signal. The awareness signal included in the speaker signal 122(*i*) represents at least a portion of the ambient sounds represented by the microphone signal 132(*i*). Conversely, the cancellation signal associated with speaker signal 122(*i*) cancels at least a portion of the ambient sounds represented by the microphone signal 132(*i*).

In general, conventional headphones that customize ambient sounds that are perceived by the user include functionality that enables a user to manually control the volumes of ambient sounds that the user hears via the conventional headphones. For instance, in some conventional headphones, the user may manually adjust all or a portion of the ambient sounds that are reproduced by the headphones. The speakers then output the manually selected ambient sounds in conjunction with the requested sounds.

Requiring a user to manually control the degree to which ambient sound is reproduced by the headphones may reduce the user's ability to perform certain types of tasks. For example, when the user is concentrating on a task, retrieving a smartphone, executing a headphone configuration application via the smartphone, and then making manual selections via the headphone configuration application may reduce the user's ability to concentrate on the task. Further, at times, the user may be unable or unwilling to make such a manual selection. For example, if the user forgets the location of a physical button or slider that is configured to adjust the volume of ambient sound, then the user may be unable to control the degree to which ambient sound is reproduced by the headphones. In another example, if the user is wearing gloves, then the user may be unable to properly manipulate a button or slider in order to properly adjust the volume of ambient sound that can be heard by the user.

Automatically Optimizing Listening Experiences Based on Focus Levels

To address the aforementioned limitations of manually customizing ambient sounds that are perceived by the user, the system 100 includes, without limitation, the biometric sensor 140 and a focus application 150. The biometric sensor 140 specifies neural activity associated with the user via a biometric signal 142. For instance, in some embodiments, the biometric sensor 140 comprises an electroencephalography (EEG) sensor that measures electrical activity of the brain to generate the biometric signal 142. The biometric sensor 140 may be situated in any technically feasible fashion that enables the biometric sensor 140 to measure neural activity associated with the user. For instance, in the embodiment depicted in FIG. 1, the biometric sensor 140 is embedded in the headband of the headphones, proximate to the user's brain.

In the same or other embodiments, the system 100 may include any number of biometric sensors 140. Each of the biometric sensors 140 specifies a physiological or behavioral aspect of the user relevant to determining a focus level associated with the user via a different biometric signal 142. Additional examples of biometric sensors 140 include, without limitation, functional near-infrared spectroscopy (fNIRS) sensors, galvanic skin response sensors, acceleration sensors, eye gaze sensors, eye lid sensors, pupil sensors, eye muscle sensors, pulse sensors, heart rate sensors, and so forth.

Figure 2:
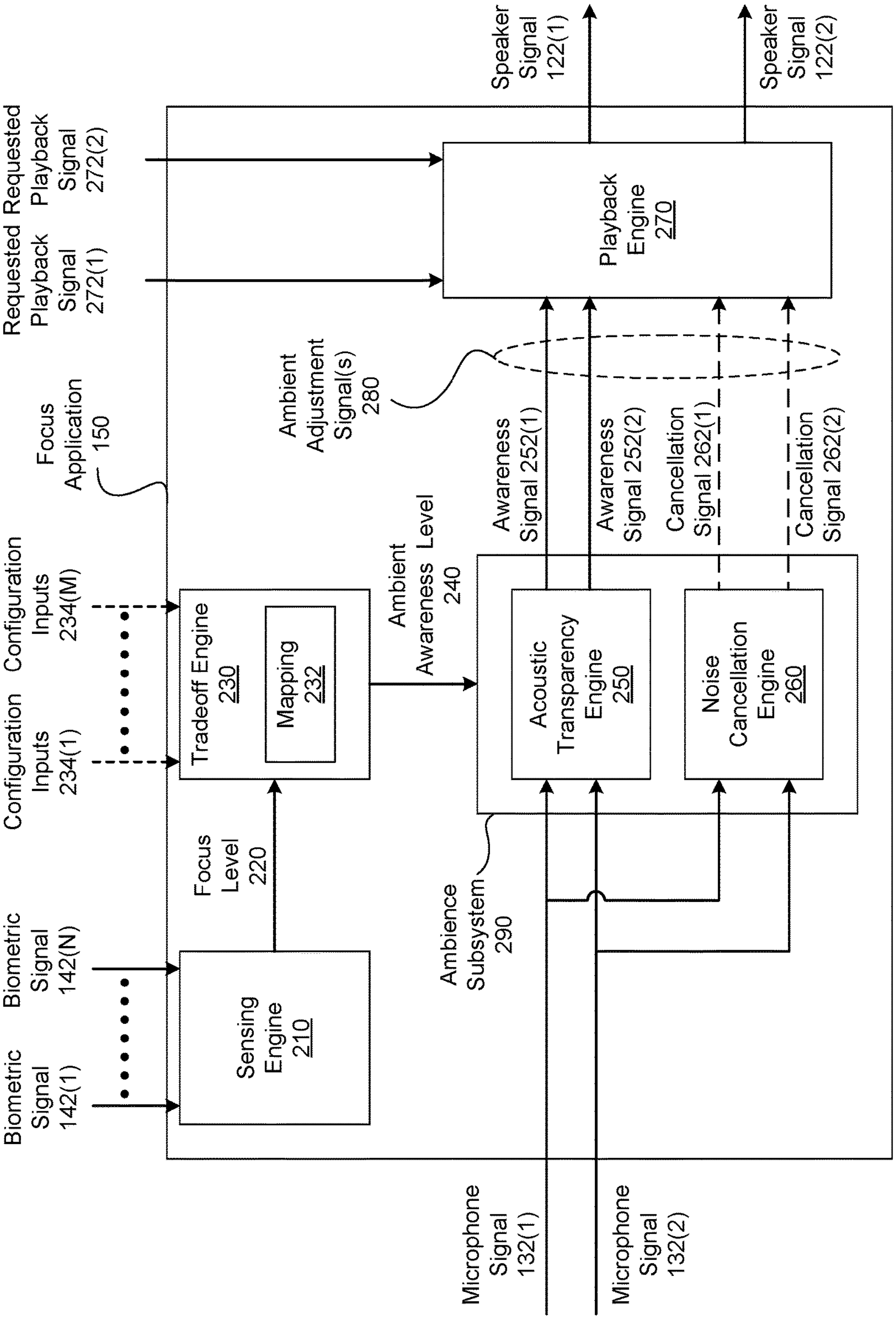
FIG. 2 is a more detailed illustration of the focus application of FIG. 1, according to various embodiments.

As described in greater detail in conjunction with FIG. 2, the focus application 150 determines a focus level associated with the user based on the biometric signal(s) 142. The focus level indicates a level of concentration by the user. Subsequently, the focus application 150 sets an ambient awareness level based on the focus level and a mapping between the focus level and the ambient awareness level. The ambient awareness level specifies one or more characteristics of ambient sound(s) to be perceived by the user. For example, the ambient awareness level could specify an overall volume for the ambient sounds that are to be received by the user when wearing the headphones. In general, the mapping includes a relationship between the ability of a user to concentrate on a task and the ability of the user to engage with their surrounding environment.

Advantageously, the user is not required to make a manual selection to tailor their listening experience to reflect their activities and surrounding environment. For instance, in some embodiments, if the user is focusing on a particular task, then the focus application 150 may automatically decrease the ambient awareness level to increase the ability of the user to focus on the task. If, however, the user is not focusing on any task, then the focus application 150 may automatically increase the ambient awareness level to increase the ability of the user to engage with people and things in their surrounding environment.

For each of the speakers 120(*i*) the focus application 150 generates an ambient adjustment signal based on the ambient awareness level and the microphone signal 132(*i*). Notably, for the microphone signal 132(*i*) the ambient adjustment signal comprises a noise cancellation signal or an awareness signal based on the ambient awareness level. For each of the speakers 120(*i*), the focus application 150 then generates the speaker signal 122(*i*) based on the corresponding ambient adjustment signal and requested playback signal (not shown in FIG. 1) representing audio content (e.g., music) targeted to the speaker 120(*i*).

As shown, the focus application 150 resides in a memory 116 that is included in the compute instance 110 and executes on a processor 112 that is included in the compute instance 110. The processor 112 and the memory 116 may be implemented in any technically feasible fashion. For instance, and without limitation, in various embodiments, any combination of the processor 112 and the memory 116 may be implemented as a stand-alone chip or as part of a more comprehensive solution that is implemented as an application-specific integrated circuit (ASIC) or a system-on-a-chip (SoC). In alternate embodiments, all or part of the functionality described herein for the focus application 150 may be implemented in hardware in any technically feasible fashion.

In some embodiments, as depicted in FIG. 1, the compute instance 110 includes, without limitation, both the memory 116 and the processor 112 and may be embedded in or mounted on a physical object (e.g., a plastic headband) associated with the system 100. In alternate embodiments, the system 100 may include any number of processors 112 and any number of memories 116 that are implemented in any technically feasible fashion. Further, the compute instance 110, the processor 112, and the memory 116 may be implemented via any number of physical resources located in any number of physical locations. For instance, in some alternate embodiments, the memory 116 may be implemented in a cloud (i.e., encapsulated shared resources, software, data, etc.) and the processor 112 may be included in a smartphone. Further, the functionality included in the focus application 150 may be divided across any number of applications that are stored in any number of memories 116 and executed via any number of processors 112.

The processor 112 generally includes a programmable processor that executes program instructions to manipulate input data. The processor 112 may include any number of processing cores, memories, and other modules for facilitating program execution. In general, the processor 112 may receive input via any number of input devices (e.g., the microphones 130, a mouse, a keyboard, etc.) and generate output for any number of output devices (e.g., the speakers 120, a display device, etc.).

The memory 116 generally comprises storage chips such as random access memory (RAM) chips that store application programs and data for processing by the processor 112. In various embodiments, the memory 116 includes non-volatile memory such as optical drives, magnetic drives, flash drives, or other storage. In some embodiments, a storage (not shown) may supplement or replace the memory 116. The storage may include any number and type of external memories that are accessible to the processor 112. For example, and without limitation, the storage may include a Secure Digital Card, an external Flash memory, a portable compact disc read-only memory (CD-ROM), an optical storage device, a magnetic storage device, or any suitable combination of the foregoing.

Note that the system 100 and techniques described herein are illustrative rather than restrictive, and may be altered without departing from the broader spirit and scope of the contemplated embodiments. Many modifications and variations on the system 100 and the functionality provided by the focus application 150 will be apparent to those of ordinary skill in the art without departing from the scope and spirit of the described embodiments. For instance, in some embodiments, the focus application 150 may compute a different ambient awareness level for each of the ears of the user based on the focus level and different configuration inputs. Further, the configuration inputs may specify that one of the ears is to be acoustically isolated from ambient sounds irrespective of the focus level associated with the user, while the other ear is to be selectively isolated from ambient sounds based on the focus level associated with the user.

For explanatory purposes only, the focus application 150 is described herein in the context of the system 100 comprising the headphones depicted in FIG. 1. However, as persons skilled in the art will recognize, in alternate embodiments, the system 100 may comprise any type of audio system that enables any number of users to receive music and other requested sounds from any number and type of listening and communications systems while controlling the ambient sounds that the user perceives. Examples of listening and communication systems include, without limitation, MP3 players, CD players, streaming audio players, smartphones, etc.

In some alternate embodiments, the system 100 may render any type of listening experience for any number of users via any number and combination of audio devices. Examples of audio devices include, without limitation, earbuds, hearables, hearing aids, personal sound amplifiers, personal sound amplification products, headphones, and the like. In the same or other embodiments, the system 100 may include any number of speakers 120 that render any type of listening experiences for any number of users. For instance, the speakers 120 may render monophonic listening experiences, stereo listening experiences, 2-dimensional (2D) surround listening experiences, 3-dimensional (3D) spatial listening experiences, etc. For each user, irrespective of the audio system in which the focus application 150 is implemented, the focus application 150 optimizes the listening experience to increase the ability of the user to perform a wide variety of activities without requiring the user to explicitly interact with any type of device or application.

In some alternate embodiments, the system 100 comprises an in-vehicle audio system that, for each occupant of the vehicle, controls sounds external to the vehicle and sounds from within the vehicle (e.g., associated with the other occupants) that the occupant perceives. The in-vehicle audio system includes, without limitation, the focus application 150, different speakers 120 that target different occupants, microphones 130 that are mounted on the exterior of the vehicle, different microphones 130 that target different occupants, and biometric sensors 140 embedded in head rests.

For each occupant, the focus application 150 determines the focus level of the occupant based on the biometric sensor 140 proximate to the occupant. For each occupant, the focus application 150 then determines an ambient awareness level associated with the occupant based on the focus level of the occupant. Subsequently, for each occupant, the focus application 150 generates an ambient adjustment signal targeted to the occupant based on the ambient awareness level associated with the occupant and the microphone signals 132. Finally, for each occupant, the focus application 150 composites the requested playback signal representing requested audio content targeted to the occupant with the ambient awareness signals targeted to the occupant to generate the speaker signal 122 associated with the occupant.

In some alternate embodiments, an in-vehicle audio system includes, without limitation, the focus application 150, any number of speakers 120 that target different occupants, microphones 130 that are mounted on the exterior of the vehicle, different microphones 130 that target different occupants, and biometric sensors 140 embedded in head rests. Each of the speakers 120 may be integrated with the vehicle, integrated into wireless earbuds worn by an occupant the vehicle, or integrated into earbuds that are wired to the vehicle and worn by an occupant of the vehicle.

In various alternate embodiments, the functionality of the focus application 150 may be tailored based on the capabilities of the system 100. For instance, as a general matter, the system 100 may enable any number of techniques for controlling perceived ambient sounds, and the focus application 150 may implement any number of the techniques. Some examples of techniques for controlling perceived ambient sounds, without limitation, acoustic transparency techniques, active noise cancellation techniques, and passive noise cancellation techniques. Acoustic transparency techniques involve electro-acoustical transmission of ambient sounds. Active noise cancellation techniques involve electro-acoustical cancellation of ambient sounds. Passive noise cancellation techniques selectively insulate the ears of the user from ambient sounds via physical component(s).

The system 100 comprising the headphones described in conjunction with FIG. 1 implements both acoustic transparency techniques and active noise cancellation techniques. To enable the user to perceive at least a portion of the ambient sounds detected by the microphone 130(*i*), the focus application 150 performs any number and type of acoustic transparency operations, in any combination, on the microphone signal 132(*i*) to generate the awareness signal. Examples of acoustic transparency operations include, without limitation, replication, filtering, reduction, and augmentation operations. To prevent the user from perceiving ambient sounds detected by the microphone 130(*i*), the focus application 150 generates a cancellation signal that is an inverse version of the microphone signal 132(*i*).

In alternate embodiments, the system 100 may comprise headphones that implement passive noise cancellation techniques. For instance, in some embodiments, the headphones may include physical flaps that can be incrementally opened or closed to adjust the ambient sounds that "leak" through the headphones to the ears of the user. In such embodiments, the focus application 150 may control the physical flaps in any technically feasible fashion to reflect the ambient awareness level.

FIG. 2 is a more detailed illustration of the focus application 150 of FIG. 1, according to various embodiments. As shown, the focus application 150 includes, without limitation, a sensing engine 210, a tradeoff engine 230, an ambience subsystem 290, and a playback engine 270. In general, the focus application 150 customizes a listening experience for a user based on any number of biometric signals 142 associated with the user and any number (including zero) of configuration inputs 234. In operation, as the focus application 150 receives the microphones signals 132 and requested playback signals 272, the focus application 150 generates the speaker signals 122.

The sensing engine 210 determines a focus level 220 associated with the user based on the biometric signals 142. The sensing engine may determine the focus level 220 in any technically feasible fashion. For instance, in some embodiments, the sensing engine 210 receives the biometric signal 142 from an EEG sensor. The sensing engine 210 performs prepossessing operations, including noise reduction operations, on aggregate data received via the biometric signal 142 to generate a filtered biometric signal. The sensing engine 210 then evaluates the filtered biometric signal to classify neural activity that is known to pertain to focusing behaviors. Some examples of techniques that the focus application 150 may implement to classify neural activity include, without limitation, synchronization of multiple hemispheres, Fourier transformation, wavelet transformation, eigenvector techniques, autoregressive techniques, or others feature extraction techniques.

In alternate embodiments, the sensing engine 210 may receive the biometric signal 142 from an fNIRS sensor that measures blood oxygenation levels in prefrontal cortical areas pertaining to episodic memory, strategy formation, planning and attention. In such embodiments, the sensing engine 210 may evaluate the biometric signal 142 to detect increases in the blood oxygenation levels that may indicate cognitive activities associated with a higher focus level 220.

In various embodiments, the sensing engine 210 evaluates a combination of the biometric signals 142 to determine the focus level 220 based on sub-classifications of focus. For example, the sensing engine 210 could estimate a task focus based on the biometric signal 142 received from an EEG sensor and a task demand based on the biometric signal 142 received from an fNIRS sensor. As referred to herein, the "task demand" indicates an amount of cognitive resources associated with a current task. For instance, if the biometric signal 142 received from the fNIRS sensor indicates that the user is actively problem solving or engaging complex working memory, then the sensing engine 210 would estimate a relatively high task demand. The sensing engine 210 could then compute the focus level 220 based on the task focus and the task demand.

In another example, if the sensing engine 210 determines that the biometric signal 142 received from an EEG sensor includes features that indicate that the user is focused, then the sensing engine 210 could evaluate additional biometric signals 142 to precisely determine the focus level 220. For instance, the sensing engine could evaluate biometric signals 142 received from acceleration sensors and eye gaze sensors to determine, respectively, the amount of head movements and saccades. In general, as the focus of the user increases, both the amount of head movements and saccades decrease.

In alternate embodiments, the sensing engine 210 may be trained to set the focus level 220 to a particular value when the biometric signal 142 received from an EEG sensor indicates that the user is thinking of a specific trigger. For instance, the sensing engine 210 could be trained to set the focus level 220 to indicate that the user is deep in concentration when the user thinks about the word "performing,"

"testing," or "working." The sensing engine 210 could be trained to identify the key thought in any technically feasible fashion. For instance, the sensing engine 210 could be trained during a setup process in which the user repeatedly thinks about the selected trigger while the sensing engine 210 monitors the biometric signal 142 received from the EEG sensor.

The tradeoff engine 230 computes an ambient awareness level 240 based on the focus level 220, a mapping 232, and any number of configuration inputs 234. The mapping 232 specifies a relationship between the ability of a user to concentrate on a task and the ability of the user to engage with their surrounding environment. In general, the mapping 232 may specify any relationship between the focus level 220 and the ambient awareness level 240 in any technically feasible fashion.

For explanatory purposes only, as referred to herein, the focus level 220 ranges from 0 to 1, where 0 indicates that the user is completely unfocused and 1 indicates that the user is completely focused. Further, the ambient awareness level 240 ranges from 0 to 1, where 0 indicates that the user is to perceive no ambient sounds and 1 indicates that the user is to perceive all ambient sounds. In alternate embodiments, the focus level 220 may represent the user's focus in any technically feasible fashion and the ambient awareness level 240 may represent ambient sounds that the user is to perceive in any technically feasible fashion.

In some embodiments, the mapping 232 specifies an inversely proportional relationship between the focus level 220 and the ambient awareness level 240. As the user becomes increasingly focused, the focus application 150 decreases the ability of the user to perceive ambient sounds and, consequently, the user is able to perform tasks requiring concentration more effectively. By contrast, as the user becomes less focused, the focus application 150 increases the ability of the user to perceive ambient sounds and, consequently, the user is able to engage more effectively in the environment and activities surrounding the user.

In other embodiments, the mapping 232 specifies a proportional relationship between the focus level 220 and the ambient awareness level 240. As the user becomes increasingly focused, the focus application 150 increases the ability of the user to perceive ambient sounds—providing a more social environment for the user. By contrast, as the user becomes less focused, the focus application 150 decreases the ability of the user to perceive ambient sounds—encouraging the user to focus on a task that requires concentration. For example, a proportional relationship could encourage a user to be sufficiently focused to progress to an overall solution of a problem without becoming overly focused on particular details.

In yet other embodiments, the mapping 232 specifies a threshold disable with step, where the focus levels 220 from zero to a threshold map to the ambient awareness level 240 of 1, and other focus levels 220 map to the ambient awareness level 240 of 0. As a result, the focus application 150 cancels ambient sounds only when the user is sufficiently focused (as specified by the threshold). By contrast, in other embodiments 232, the mapping 232 specifies a threshold enable with step, where the focus levels 220 from zero to a threshold map to the ambient awareness level 240 of 0 and other focus levels 220 map to the ambient awareness level 240 of 1. As a result, the focus application 150 enables the user to perceive ambient sounds only when the user is sufficient focused (as specified by the threshold).

The tradeoff engine 230 may determine the mapping 232 and any parameters (e.g., threshold) associated with the mapping 232 in any technically feasible fashion. For instance, in some embodiments, the tradeoff engine 230 may implement a default mapping 232. In the same or other embodiments, the tradeoff engine 230 may determine the mapping 232 and any associated parameters based on one or more of the configuration inputs 234. Examples of the configuration inputs 234 include, without limitation, a location of the user, configurable parameters (e.g., the threshold), and crowdsourced data.

For instance, if the configuration input 234 indicates that the user is currently in a library, then the user is likely to be concentrating on an important task. Consequently, the tradeoff engine 230 could select the mapping 232 that specifies a threshold disable with step and set the threshold to a relative low value. By contrast, if the configuration input 234 indicates that the user is currently at the beach, then the user is likely to be enjoying the surroundings. Consequently, the tradeoff engine 230 could select the mapping 232 that specifies a threshold enable with a step and set the threshold to a relatively low value.

As shown, the ambience subsystem 290 receives the ambient awareness level 240 and generates ambient adjustment signals 280. The ambience awareness subsystem 290 includes, without limitation, an acoustic transparency engine 250 and a noise cancellation engine 260. At any given time, the ambiance subsystem 290 may or may not generate the ambient adjustment signals 280. Further, if the ambience subsystem 290 generates the ambient adjustment signals 280, then at any given time, the ambient adjustment signals 280 comprise either awareness signals 252 generated by the acoustic transparency engine 250 or noise cancellation signals 262 generated by the noise cancellation engine 260. An example of three phases that may be implemented by the ambience awareness subsystem 290 based on the ambient awareness level 240 is described in conjunction with FIG. 5.

More precisely, if the ambient awareness level 240 is not zero, then the ambience subsystem 290 disables the noise cancellation engine 260. Further, depending on the ambient awareness level 240, the ambience subsystem 290 may configure the acoustic transparency engine 250 to generate the awareness signals 252 based on the microphone signals 132 and the ambient awareness level 240. Consequently, as depicted in FIG. 2, the ambient adjustment signals 280 may comprise the ambient awareness signals 252. If, however, the ambient awareness level 240 is zero, then the ambience subsystem 290 disables the acoustic transparency engine 250 and configures the noise cancellation engine 260 to generate the cancellation signals 262 based on the microphone signals 132. Consequently, the ambient adjustment signals 280 comprise the cancellation signals 262.

In this fashion, the acoustic transparency engine 250 and the noise cancellation engine 260 may provide a continuum of perceived ambient sounds to the user. For instance, in some embodiments, headphones that do not provide an entirely closed fit with the ears of the user and, consequently, ambient sounds "bleed" through the headphones to the user. If the ambient awareness level 240 is zero, then the noise cancellation engine 260 generates cancellation signals 250 that actively cancel the ambient sounds that bleed through the headphones to minimize the ambient sounds perceived by the user. If, however, the ambient awareness level 240 indicates that the user is to receive the ambient sounds that bleed through the headphones, then the ambient subsystem 290 does not generate any ambient adjustment signals 280. Consequently, the user perceives some ambient sounds. If, however, the ambient awareness level 240 indicates that the user is to receive ambient sounds that do not bleed through the headphones, then the acoustic transparency engine 250 generates the awareness signals 252 based on the microphone signals 132 and the ambient awareness level 240. As a result, the user may perceive a wide variety of ambient sounds via different mechanisms.

In alternate embodiments, the ambience subsystem 290 may implement any number and type of techniques to customize the ambient sounds perceived by the user. For instance, in some embodiments, the ambience subsystem 290 includes the acoustic transparency engine 250 but not the noise cancellation engine 260. In other embodiments, the ambience subsystem 290 includes the acoustic transparency engine 250 and a passive cancellation engine that controls physical noise suppression components associated with the system 100.

The acoustic transparency engine 250 may perform any number and type of acoustic transparency operations, in any combination, on the microphone signals 132 to generate the ambient adjustment signals 280. Examples of acoustic transparency operations include, without limitation, replication, filtering, reduction, and augmentation operations. For instance, in some embodiments, when the ambient awareness level 240 is relatively high, the acoustic transparency engine 250 may increase the volume of voices represented by the microphone signals 132 while maintaining or decreasing the volume of other sounds represented by the microphone signals 132.

In the same or other embodiments, if the ambient awareness level 240 is relatively low, then the acoustic transparency engine 250 may be configured to filter out all sounds that are not typically conducive to focus, and transmit the remaining sounds via the microphone signals 132. Examples of sounds that could be considered conducive to focus include, without limitation, sounds of nature (e.g., birds chirping, wind, waves, river sounds, etc.) and white/pink masking sounds from devices near the user such as fans or appliances. In alternate embodiments, the acoustic transparency engine 250 may determine the types of sounds to filter based on the configuration inputs 234, such as the location of the user, configurable parameters, crowdsourced data, and machine learning data that indicates the type of sounds that tend to increase focus, In some embodiments, the acoustic transparency engine 250 may perform operations on the microphone signals 132 to generate ambient signals, generate any number of simulated signals, and then composite the ambient signals with the simulated signals to generate the awareness signals 252. For example, if the ambient awareness level 240 is relatively low, then the acoustic transparency engine 250 could generate simulated signals that represent soothing music, prerecorded sounds of nature, and/or white/pink masking noise. In alternate embodiments, the acoustic transparency engine 250 may determine the types of sounds to simulate based on the configuration inputs 234.

As shown, upon receiving the associated ambient adjustment signal 280(*i*), the playback engine 270 generates the speaker signal 122(*i*) based on the ambient adjustment signal 280(*i*) and the requested playback signal 272(*i*). The playback engine 270 may generate the speaker signal 122(*i*) in any technically feasible fashion. For example, the playback engine 270 could composite the ambient adjustment signal 280(*i*) and the corresponding playback signal 272(*i*) to generate the speaker signal 122(*i*). The playback engine 270 then transmits each of the speaker signals 122(*i*) to the corresponding speaker 120(*i*). As a result, while the user receives the requested audio content, the user also perceives ambient sounds that optimize the overall listening experience for the user.

Note that the techniques described herein are illustrative rather than restrictive, and may be altered without departing from the broader spirit and scope of the contemplated embodiments. Many modifications and variations on the system 100 and the functionality provided by the focus application 150 will be apparent to those of ordinary skill in the art without departing from the scope and spirit of the described embodiments.

For instance, in some embodiments, for each of the speakers 120, the tradeoff engine 230 maps the focus level 220 to different ambient awareness levels 240 based on different configuration inputs 234. For example, the configuration inputs 234(1) could specify that the tradeoff engine 230 is to minimize the ambient sounds perceived by the user via the speaker 120(1). By contrast, the configuration input 234(2) could specify that the tradeoff engine 230 is to implement an inversely proportional mapping 232 between the focus level 220 and the ambient awareness level 240(2) associated with the speaker 120(2). As a result, the tradeoff engine 230 would set the ambient awareness level 240(1) associated with the speaker 220(1) to 1 irrespective of the focus level 220, and would vary the ambient awareness level 240(2) associated with the speaker 220(2) based on the focus level 220.

In the same or other embodiments, the ambience subsystem 290 may generate any number of ambient adjustment signals 280 based on any number of different combinations of the microphones 130 and the speakers 120. More precisely, for a particular speaker 120, the ambience subsystem 290 may generate the corresponding ambient adjustment signal 280 based on any number of the microphone signals 132 and the focus level 220 corresponding to the speaker 120. For example, if the system 100 comprises an in-vehicle infotainment system, then each of the occupants may be associated with multiple microphones 130 and multiple speakers 120. Further, each of the speakers 120 may be associated with different configuration inputs 234. Accordingly, for each of the speakers 120 that target a particular user, the ambience subsystem 290 could generate the corresponding ambience adjustment signal 280 based the microphone signals 132 representing sounds associated with the other occupants and the focus level 220 associated with the speaker 120.

Mapping Focus Levels to Ambient Awareness Levels

Figure 3:
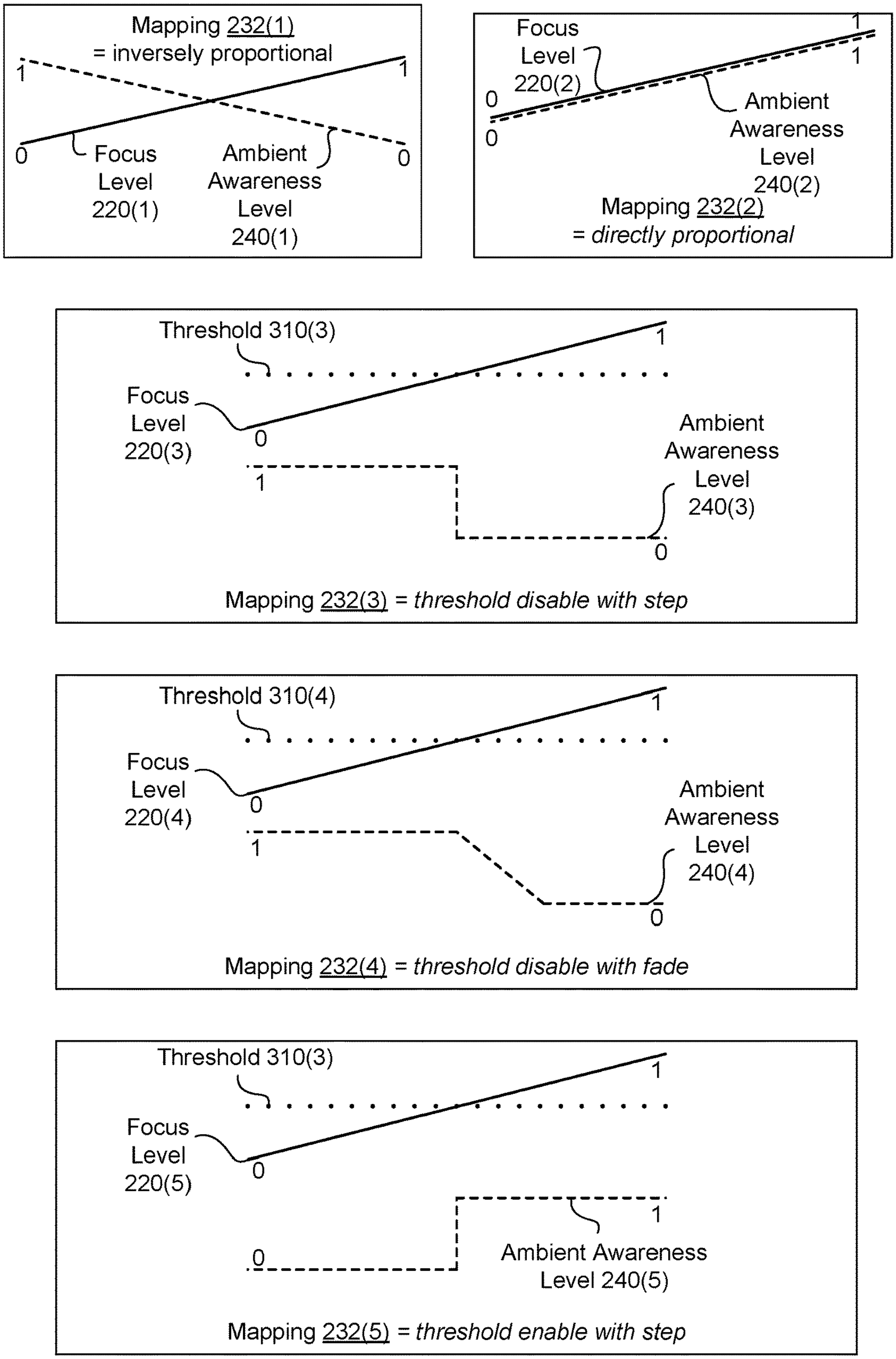
FIG. 3 illustrates examples of different mappings that can be implemented by the tradeoff engine of FIG. 2, according to various embodiments.

FIG. 3 illustrates examples of different mappings 232 that can be implemented by the tradeoff engine 230 of FIG. 2, according to various embodiments. In alternate embodiments, the tradeoff engine 230 may implement any number and type of the mappings 232. In each of the mappings 232(*i*), the focus level 220(*i*) is depicted with a solid line that ranges from 0 (user is completely unfocused) to 1 (user is completely focused). The corresponding ambient awareness level 240(*i*) is depicted with a dashed line that ranges from 0 (the user is to perceive no ambient sounds) to 1 (the user is to perceive all ambient sounds).

As shown, the mapping 232(1) specifies an inversely proportional relationship between the focus level 220(1) and the ambient awareness level 240(1). When the tradeoff engine 230 implements the mapping 232(1), as the user becomes increasingly focused, the tradeoff engine 230 decreases the ambient awareness level 240(1). As a result, the focus application 150 decreases the ability of the user to perceive ambient sounds. By contrast, as the user becomes less focused, the tradeoff engine 230 increases the ambient awareness level 240(1). As a result, the focus application 150 increases the ability of the user to perceive ambient sounds.

The mapping 232(2) specifies a directly proportional relationship between the focus level 220(2) and the ambient awareness level 240(2). When the tradeoff engine 230 implements the mapping 232(2), as the user becomes increasingly focused, the tradeoff engine 230 increases the ambient awareness level 240(2). As a result, the focus application 150 increases the ability of the user to perceive ambient sounds. By contrast, as the user becomes less focused, the tradeoff engine 230 decreases the ambient awareness level 240(2). As a result, the focus application 150 decreases the ability of the user to perceive ambient sounds.

The mapping 232(3) specifies a threshold disable with step. When the tradeoff engine 230 implements the mapping 232(3), if the focus level 220(3) is between zero and the threshold 310(3), then the tradeoff engine 230 sets the ambient awareness level 240(3) to 1. Otherwise, the tradeoff engine 230 sets the ambient awareness level 240(3) to 0. As a result, the focus application 150 toggles between preventing the user from perceiving all ambient sounds when the user is sufficiently focused (as specified by the threshold 310(3)) and allowing the user to perceive all ambient sounds.

The mapping 232(4) specifies a threshold disable with ramp. When the tradeoff engine 230 implements the mapping 232(4), if the focus level 220(4) is between zero and the threshold 310(4), then the tradeoff engine 230 sets the ambient awareness level 240(4) to 1. As the focus level 220(4) increases past the threshold 310(4), the tradeoff engine 230 gradually decreases the ambient awareness level 240(4) until the ambient awareness level 240(4) is 0. As the focus level 220(4) continues to increase, the tradeoff engine 230 continues to set the ambient awareness level 240(4) to 0.

The mapping 232(5) species a threshold enable with step. When the tradeoff engine 230 implements the mapping 232(5), if the focus level 220(5) is between zero and the threshold 310(5), then the tradeoff engine 230 sets the ambient awareness level 240(5) to 0. Otherwise, the tradeoff engine 230 sets the ambient awareness level 240(5) of 1. As a result, the focus application 150 toggles between allowing the user to perceive all ambient sounds when the user is sufficiently focused (as specified by the threshold 310(5)) and preventing the user from perceiving any ambient sounds.

Figure 4:
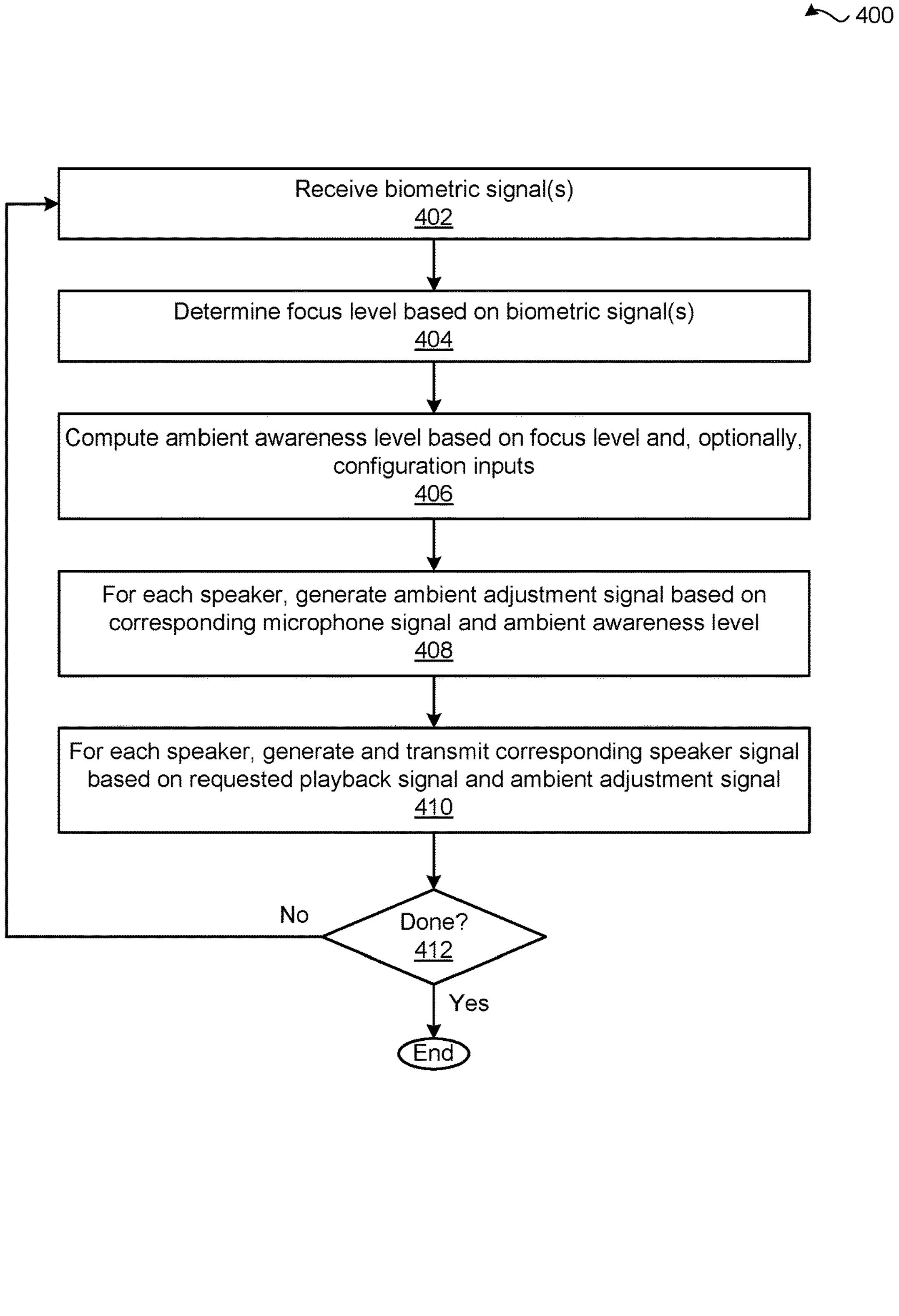
FIG. 4 is a flow diagram of method steps for controlling ambient sounds perceived by a user, according to various embodiments.

FIG. 4 is a flow diagram of method steps for controlling ambient sounds perceived by a user, according to various embodiments. Although the method steps are described in conjunction with the systems of FIGS. 1-3, persons skilled in the art will understand that any system configured to implement the method steps, in any order, falls within the scope of the contemplated embodiments. FIG. 4.

As shown, a method 400 begins at step 402, where the sensing engine 210 receives the biometric signals 142. At step 404, the sensing engine 210 determines the focus level 220 based on the biometric signals 142. At step 406, the tradeoff engine 232 computes the ambient awareness level 240 based on the focus level 220 and, optionally, any number of the configuration inputs 234. In alternate embodiments, as described in detail in conjunction with FIG. 2, for each of the speakers 120, the tradeoff engine 232 may compute a different focus level 220 based on different configuration inputs 234.

At step 408, for each of the speakers 220, the ambience subsystem 290 generates the corresponding ambient adjustment signal 280 based on the corresponding microphone signal 132 and the ambient awareness level 240. In alternate embodiments, for each of the speakers 220, the ambience subsystem 290 may generate any number of ambient adjustment signals 280 based on any number of the microphone signals 132. In particular, as described in detail in conjunction with FIG. 2, for a particular speaker 120, the ambience subsystem 290 may generate the corresponding ambient adjustment signal 280 based on any number of the microphone signals 132 and the focus level 220 associated with the user targeted by the speaker 120.

At step 410, for each of the speakers 120, the playback engine 270 generates the corresponding speaker signal 122 based on the corresponding ambient adjustment signal 280 and the corresponding requested playback signal 272. Advantageously, the speaker signals 122 cause the speakers 120 to provide the requested audio content to the user while automatically optimizing the ambient sounds that the user perceives. The method 400 then terminates.

Figure 5:
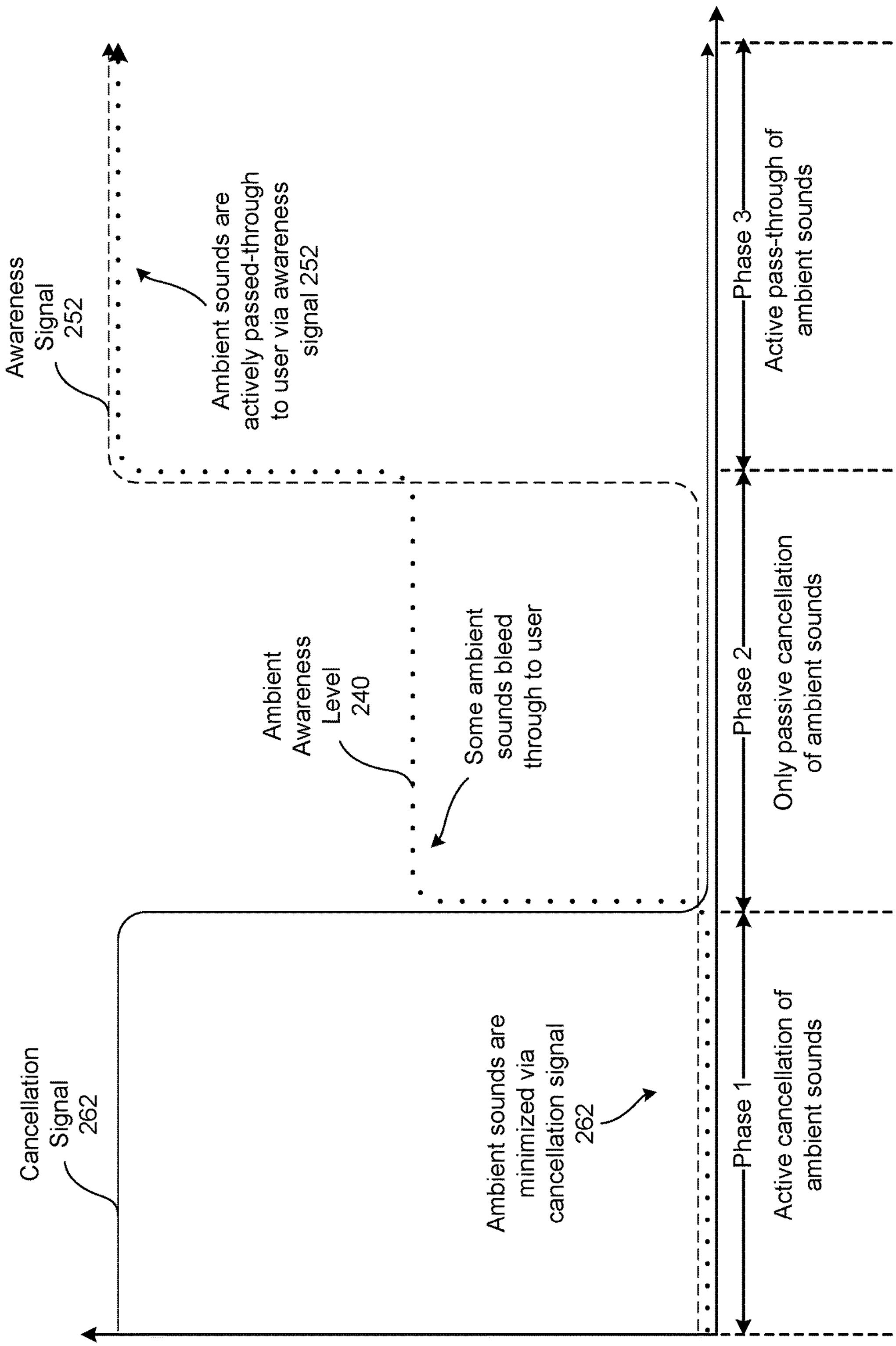
FIG. 5 illustrates an example of three phases that the ambience subsystem of FIG. 2 may implement in response to the ambience awareness level, according to various embodiments.

FIG. 5 illustrates an example of three phases that the ambience subsystem 290 of FIG. 2 may implement in response to the ambience awareness level 240, according to various embodiments. As shown, the ambient awareness level 240 is depicted with a dotted line, the cancellation signal 262 is depicted with a solid line, and the awareness signal 252 is depicted with a dashed line. In alternate embodiments, the ambient subsystem 290 may respond to the ambient awareness level 240 in any technically feasible fashion.

During phase 1, the ambient awareness level 240 is within a low range and, consequently, the ambience subsystem 290 generates the cancellation signal 262 that minimizes the ambient sounds that the user perceives. Note that during phase 1, the ambient subsystem 290 does not generate the awareness signal 252. During phase 2, the ambient awareness level 240 is within a mid range and, consequently, the ambience subsystem 290 generates neither the cancellation signal 262 nor the awareness signal 252. Because the ambient subsystem 290 generates neither the cancellation signal 262 nor the awareness signal 252, some ambient sounds bleed through to the user. During phase 3, the ambient awareness level 240 is within a high range and, consequently, the ambient subsystem 290 generates the awareness signal 252 that passes-through the ambient sounds to the user. Note that during the phase 3, the ambient subsystem 290 does not generate the cancellation signal 262.

In sum, the disclosed techniques may be used to adjust ambient sounds perceived by a user based on their focus level. A focus application includes, without limitation, a sensing engine, a tradeoff engine, an ambience subsystem, and a playback engine. The ambience subsystem includes, without limitation, an acoustic transparency engine and a noise cancellation engine. In operation, the sensing engine receives any number of biometric signals from biometric sensors and determines a focus level associated with the user based on the biometric signals. The tradeoff engine then determines an ambient awareness level based on the focus level and, optionally, any number of configuration inputs. Examples of a configuration input include, without limitation, a location of the user, configurable parameters (e.g., a threshold level), crowdsourced data, and the like. Based on the ambient awareness level and microphone signals representing external sounds, the ambience subsystem generates awareness signals that reflect the external sounds or cancellation signals that cancel the external sounds. Finally, the playback engine generates speaker signals based on requested audio content (e.g., a song) and the awareness signals or the cancellations signals.

One technical advantage of the focus application over the prior art is that, as part of generating audio content based on ambient sounds and biometric signals, the focus application can automatically optimize a tradeoff between the ability of a user to concentrate on a task and the ability of the user to engage with their surrounding environment. Notably, the user is not required to make a manual selection to tailor their listening experience to reflect their activities and surrounding environment. For instance, in some embodiments, if the focus application senses that the user is focusing on a particular task, then the focus application may automatically decrease the ambient awareness level to increase the ability of the user to focus on the task. If, however, the focus application senses that the user is not focusing on any task, then the focus application may determine the goal of the user based on any number and combination of biometric signals and configuration inputs. If the goal of the user is to focus on a task, then the focus application may automatically decrease the ambient awareness level to increase the ability of the user to focus on a task. If the goal of the user is not to focus on any task, then the focus application may automatically increase the ambient awareness level to increase the ability of the user to engage with people and things in their surrounding environment. In general, the focus application increases the ability of the user to perform a wide variety of activities without requiring the user to explicitly interact with any type of audio device or application.

1. In some embodiments, a method for controlling ambient sounds perceived by a user comprises determining a focus level based a biometric signal associated with the user; determining an ambient awareness level based on the focus level; and modifying at least one characteristic of an ambient sound perceived by the user based on the ambient awareness level.

2. The method of clause 1, wherein modifying at least one characteristic of the ambient sound perceived by the user comprises generating an ambient adjustment signal based on the ambient awareness level and an audio input signal received from a microphone in response to the ambient sound; and generating a speaker signal based on the ambient adjustment signal.

3. The method of clauses 1 or 2, wherein generating the ambient adjustment signal comprises at least one of canceling, replicating, filtering, reducing, and augmenting the audio input signal based on the ambient awareness level.

4. The method of any of clauses 1-3, wherein canceling the ambient adjustment signal comprises generating an inverse version of the audio input signal.

5. The method of any of clauses 1-4, wherein determining the ambient awareness level comprises comparing the focus level to a threshold level; and if the focus level exceeds the threshold level, then setting the ambient awareness level equal to a first value, or if the focus level does not exceed the threshold level, then setting the ambient awareness level equal to a second value.

6. The method of any of clauses 1-5, further comprising, determining the threshold level based on at least one of a location of the user, a configurable parameter, and crowdsourced data.

7. The method of any of clauses 1-6, wherein determining the ambient awareness level comprises applying a mapping to the focus level, wherein the mapping specifies an inversely proportional relationship between the ambient awareness level and the focus level or a directly proportional relationship between the ambient awareness level and the focus level.

8. The method of any of clauses 1-7, further comprising receiving the biometric signal from an electroencephalography sensor, a heart rate sensor, a functional near-infrared spectroscopy sensor, a galvanic skin response sensor, an acceleration sensor, or an eye gaze sensor.

9. The method of any of clauses 1-8, wherein the speaker is mounted inside a vehicle or is included in a pair of headphones.

10. In some embodiments, a computer-readable storage medium includes instructions that, when executed by a processor, cause the processor to control ambient sounds perceived by a user by performing the steps of determining a focus level based a first biometric signal associated with the user; determining an ambient awareness level based on the focus level; performing a passive noise cancellation operation, an active noise cancellation operation, or an acoustic transparency operation based on the ambient awareness level.

11. The computer-readable storage medium of clause 10, wherein performing the passive noise cancellation operation, the active noise cancellation operation, or the acoustic transparency operation comprises generating an ambient adjustment signal based on the ambient awareness level and an audio input signal received from a microphone in response to the ambient sound; and generating a speaker signal based on the ambient adjustment signal.

12. The computer-readable storage medium of clauses 10 or 11, wherein generating the ambient adjustment signal comprises at least one of canceling, replicating, filtering, reducing, and augmenting the audio input signal based on the ambient awareness level.

13. The computer-readable storage medium of any of clauses 10-12, wherein determining the ambient awareness level comprises comparing the focus level to a threshold level; and if the focus level exceeds the threshold level, then setting the ambient awareness level equal to a first value, or if the focus level does not exceed the threshold level, then setting the ambient awareness level equal to a second value.

14. The computer-readable storage medium of any of clauses 10-13, further comprising, determining the threshold level based on at least one of a location of the user, a configurable parameter, and crowdsourced data.

15. The computer-readable storage medium of any of clauses 10-14, wherein determining the ambient awareness level comprises applying a mapping to the focus level, wherein the mapping specifies an inversely proportional relationship between the ambient awareness level and the focus level or a directly proportional relationship between the ambient awareness level and the focus level.

16 The computer-readable storage medium of any of clauses 10-15, wherein the first biometric signal specifies neural activity associated with the user.

17. The computer-readable storage medium any of clauses 10-16, wherein determining the focus level comprises estimating a task focus based on the first biometric signal, wherein the first biometric signal is received from a first sensor; and estimating a task demand based on a second biometric signal received from a second sensor; and computing the focus level based on the task focus and the task demand.

18. The computer-readable storage medium of any of clauses 10-17, wherein determining the focus level comprises determining that the user is thinking of a trigger word based on the first biometric signal, and setting the focus level based on the trigger word.

19. In some embodiment, a system for controlling ambient sounds perceived by a user comprises a memory storing instructions; and a processor that is coupled to the memory and, when executing the instructions, is configured to determine a focus level based on a biometric signal associated with the user; generate an ambient adjustment signal based on the focus level and an audio input signal associated with an ambient sound; and control a speaker associated with the user based on the ambient adjustment signal.

20. The system of clause 19, wherein the user is a first occupant of a vehicle, and the audio input signal is received by at least one of a first microphone located on the exterior of the vehicle and a second microphone associated with a second occupant of the vehicle.

Any and all combinations of any of the claim elements recited in any of the claims and/or any elements described in this application, in any fashion, fall within the contemplated scope of the present embodiments.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A method for controlling ambient sounds perceived by a user, the method comprising:

determining a focus level based a biometric signal associated with the user;

determining an ambient awareness level based on the focus level; and modifying at least one characteristic of an ambient sound perceived by the user based on the ambient awareness level.

2. The method of claim 1, wherein modifying at least one characteristic of the ambient sound perceived by the user comprises:

generating an ambient adjustment signal based on the ambient awareness level and an audio input signal received from a microphone in response to the ambient sound; and generating a speaker signal based on the ambient adjustment signal.

3. The method of claim 2, wherein generating the ambient adjustment signal comprises at least one of canceling, replicating, filtering, reducing, and augmenting the audio input signal based on the ambient awareness level.

4. The method of claim 3, wherein canceling the ambient adjustment signal comprises generating an inverse version of the audio input signal.

5. The method of claim 1, wherein determining the ambient awareness level comprises:

comparing the focus level to a threshold level; and if the focus level exceeds the threshold level, then setting the ambient awareness level equal to a first value, or if the focus level does not exceed the threshold level, then setting the ambient awareness level equal to a second value.

6. The method of claim 5, further comprising, determining the threshold level based on at least one of a location of the user, a configurable parameter, and crowdsourced data.

7. The method of claim 1, wherein determining the ambient awareness level comprises applying a mapping to the focus level, wherein the mapping specifies an inversely proportional relationship between the ambient awareness level and the focus level or a directly proportional relationship between the ambient awareness level and the focus level.

8. The method of claim 1, further comprising receiving the biometric signal from an electroencephalography sensor, a heart rate sensor, a functional near-infrared spectroscopy sensor, a galvanic skin response sensor, an acceleration sensor, or an eye gaze sensor.

9. The method of claim 1, wherein the speaker is mounted inside a vehicle or is included in a pair of headphones.

10. One or more non-transitory computer-readable storage media including instructions that, when executed by one or more processors, cause the one or more processors to control ambient sounds perceived by a user by performing the steps of:

determining a focus level based a first biometric signal associated with the user;

determining an ambient awareness level based on the focus level; and performing a passive noise cancellation operation, an active noise cancellation operation, or an acoustic transparency operation based on the ambient awareness level.

11. The one or more computer-readable storage media of claim 10, wherein performing the passive noise cancellation operation, the active noise cancellation operation, or the acoustic transparency operation comprises:

generating an ambient adjustment signal based on the ambient awareness level and an audio input signal received from a microphone in response to the ambient sound; and generating a speaker signal based on the ambient adjustment signal.

12. The one or more computer-readable storage media of claim 11, wherein generating the ambient adjustment signal comprises at least one of canceling, replicating, filtering, reducing, and augmenting the audio input signal based on the ambient awareness level.

13. The one or more computer-readable storage media of claim 10, wherein determining the ambient awareness level comprises:

comparing the focus level to a threshold level; and if the focus level exceeds the threshold level, then setting the ambient awareness level equal to a first value, or if the focus level does not exceed the threshold level, then setting the ambient awareness level equal to a second value.

14. The one or more computer-readable storage media of claim 13, further comprising, determining the threshold level based on at least one of a location of the user, a configurable parameter, and crowdsourced data.

15. The one or more computer-readable storage media of claim 10, wherein determining the ambient awareness level comprises applying a mapping to the focus level, wherein the mapping specifies an inversely proportional relationship between the ambient awareness level and the focus level or a directly proportional relationship between the ambient awareness level and the focus level.

16. The one or more computer-readable storage media of claim 10, wherein the first biometric signal specifies neural activity associated with the user.

17. The one or more computer-readable storage media of claim 10, wherein determining the focus level comprises:

estimating a task focus based on the first biometric signal, wherein the first biometric signal is received from a first sensor;

estimating a task demand based on a second biometric signal received from a second sensor; and computing the focus level based on the task focus and the task demand.

18. The one or more computer-readable storage media of claim 10, wherein determining the focus level comprises determining that the user is thinking of a trigger word based on the first biometric signal, and setting the focus level based on the trigger word.

19. A system for controlling ambient sounds perceived by a user, the system comprising:

a memory storing instructions; and a processor that is coupled to the memory and, when executing the instructions, is configured to:

determine a focus level based on a biometric signal associated with the user;

generate an ambient adjustment signal based on the focus level and an audio input signal associated with an ambient sound; and control a speaker associated with the user based on the ambient adjustment signal.

20. The system of claim 19, wherein the user is a first occupant of a vehicle, and the audio input signal is received by at least one of a first microphone located on the exterior of the vehicle and a second microphone associated with a second occupant of the vehicle.

* * * * *